(12) United States Patent
Zheng et al.

(10) Patent No.: US 6,859,123 B2
(45) Date of Patent: Feb. 22, 2005

(54) METHODS AND APPARATUS FOR POSITIONING PERMANENT MAGNETIC BLOCKS

(75) Inventors: Jinsheng Zheng, Beijing (CN); Jinhua Huang, Florence, SC (US); Ronald Floyd Lochner, Florence, SC (US); Weijun Shen, Florence, SC (US); Hideaki Uno, Tokyo (JP); Geer Ward, Florence, SC (US); Bu-Xin Xu, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/406,531

(22) Filed: Apr. 3, 2003

(65) Prior Publication Data

US 2004/0194289 A1 Oct. 7, 2004

(51) Int. Cl.⁷ .................................................. H01F 7/00
(52) U.S. Cl. ........................ 335/296; 335/298; 335/209
(58) Field of Search ................................. 335/299, 216, 335/296

(56) References Cited

U.S. PATENT DOCUMENTS

| | | | | |
|---|---|---|---|---|
| 4,672,346 A | * | 6/1987 | Miyamoto et al. | .......... 335/296 |
| 5,283,544 A | * | 2/1994 | Sakurai et al. | .............. 335/297 |
| 5,668,516 A | | 9/1997 | Xu et al. | |
| 5,999,076 A | | 12/1999 | Becker, Jr. et al. | |
| 6,252,405 B1 | | 6/2001 | Watkins et al. | |
| 6,358,582 B1 | | 3/2002 | Nagendra et al. | |
| 6,452,472 B1 | * | 9/2002 | Aoki et al. | ................... 335/296 |
| 6,504,461 B2 | | 1/2003 | Huang et al. | |
| 6,650,210 B1 | * | 11/2003 | Raklyar et al. | ................. 335/4 |
| 6,664,878 B1 | * | 12/2003 | Chen et al. | ................... 335/296 |
| 6,694,602 B2 | * | 2/2004 | Laskaris et al. | ............. 29/602.1 |
| 2004/0016108 A1 | * | 1/2004 | Jarvis et al. | .................... 29/607 |

FOREIGN PATENT DOCUMENTS

| | | |
|---|---|---|
| EP | 1 102 077 A2 | 5/2001 |
| WO | WO 99/40593 | 8/1999 |

OTHER PUBLICATIONS

European Search Report, dated Jul. 23, 2004, Application No. EP 04 25 1881, 3 pages.

* cited by examiner

*Primary Examiner*—Lincoln Donovan
*Assistant Examiner*—Bernard Rojas
(74) *Attorney, Agent, or Firm*—Carl B. Horton, Esq.; Armstrong Teasdale LLP

(57) ABSTRACT

A method for positioning permanent magnetic blocks includes providing a plurality of magnetized blocks, positioning the magnetized blocks on a yoke in a row by applying a mechanical force at a first end of the row with a first clamping member and at a second end of the row with a second clamping member, and repositioning the blocks by reducing the mechanical force at the first end by moving the first clamping member away from the first end, and moving the second clamping member toward the second end.

20 Claims, 5 Drawing Sheets

METHODS AND APPARATUS FOR POSITIONING PERMANENT MAGNETIC BLOCKS

BACKGROUND OF THE INVENTION

This invention relates to magnetic resonance image (MRI) imaging, and, more particularly, to methods and apparatus for assembling magnetized permanent magnetic blocks used for an MRI magnetic field generator.

A highly uniform magnetic field is useful in magnetic resonance imaging (MRI) and nuclear magnetic resonance (NMR) systems as a medical device or a chemical/biological device. Popular and low maintenance cost MRI systems currently available use a permanent magnet system that creates a middle range uniform field (0.2 to 0.5 Tesla) in a pre-determined space (imaging volume). A permanent magnet system usually uses multiple permanent magnet blocks such as NdFeB to form a single magnetic object and to achieve a desired highly uniform magnetic field in the imaging volume.

For a magnetic field generator for an MRI that uses permanent magnets, the magnets used in such an apparatus are often formulated from a plurality of magnetized blocks. However, it is difficult to place un-magnetized material blocks on a yoke plate first and then magnetize each block. Therefore, in actual manufacturing, the blocks are fabricated and then magnetized before being placed on the yoke. The magnetized blocks are then arranged on the yoke plate so that each of the magnetized blocks has a same magnetic pole facing upward. A pole piece is then placed on the top of the magnetized blocks.

However, it is difficult to position the permanent magnetic blocks on the yoke for an MRI system with high uniformity and accuracy due to the nature of a very large magnetic force acting upon blocks from other blocks and with other magnetic objects (such as the pole piece). Obviously, the magnetic field uniformity for the assembled magnetic system is very much dependent on the positioning of the assembled permanent magnetic blocks. Hence, the positioning of the magnetic block dimensions is important to the quality of the magnetic field, and thus to the quality of a magnetic field generator for an MRI device. Due to the nature of multiple factors, such as material physical tolerance, magnetic interaction force, assembly tolerance, process variation, etc., the assembled magnetic blocks will not be at a perfect location as intended. Frequently, the location of the magnetic blocks needs to be adjusted to make better alignment in order to achieve a desired magnetic field.

BRIEF DESCRIPTION OF THE INVENTION

In one aspect, a method for positioning permanent magnetic blocks is provided. The method includes providing a plurality of magnetized blocks, positioning the magnetized blocks on a yoke in a row by applying a mechanical force at a first end of the row with a first clamping member and at a second end of the row with a second clamping member, and repositioning the blocks by reducing the mechanical force at the first end by moving the first clamping member away from the first end, and moving the second clamping member toward the second end.

In another aspect, a magnetic block positioning apparatus is provided. The apparatus includes a yoke having a first end and a second end distal from the first end, a first clamping member support attached to the yoke at the first end, a first clamping member movably coupled to the first clamping member support, a second clamping member support attached to said yoke at said second end, and a second clamping member movably coupled to said second clamping member support.

In yet another aspect, a magnetic block positioning apparatus includes a plate including a linearly extending middle section having a first end and a second end, a first end section extending obliquely from the first end, and a second end section extending obliquely from the second end, a first clamping member holder extending at least over the middle section, and a second clamping member holder mounted to the first end section, the second clamping member holder nonlinear with the first clamping member holder.

DETAILED DESCRIPTION OF THE INVENTION

As used herein, an element or step recited in the singular and proceeded with the word "a" or "an" should be understood as not excluding plural said elements or steps, unless such exclusion is explicitly recited. Furthermore, references to "one embodiment" of the present invention are not intended to be interpreted as excluding the existence of additional embodiments that also incorporate the recited features.

Figure 1:
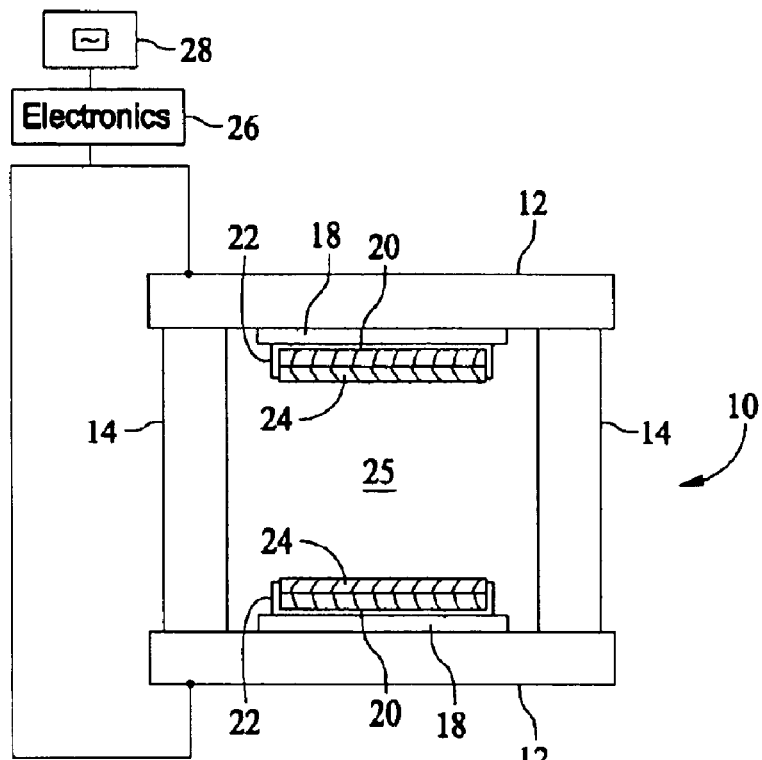
FIG. 1 is a block schematic diagram of an imaging system.
Figure 2:
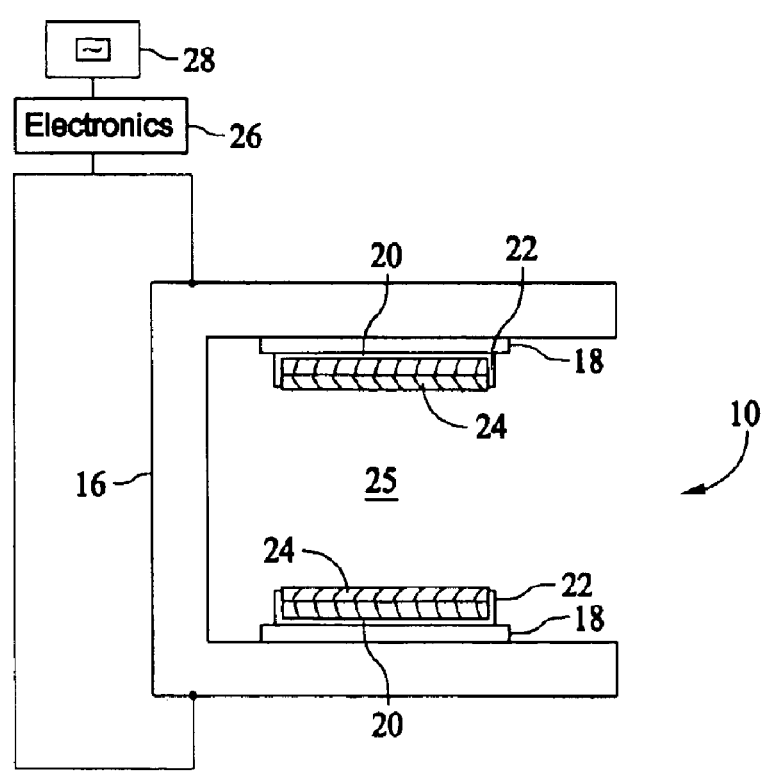
FIG. 2 is a block schematic diagram of an imaging system.

FIG. 1 is a block schematic diagram of an imaging system 10 such as an MRI system 10 including two plate yokes 12 and a plurality of columnar yokes 14 extending between plate yokes 12. Alternatively, an MRI system 10 with a single C shaped yoke 16 may be used as shown in FIG. 2. System 10 includes magnets 18 secured to yoke surfaces, pole piece bases 20 and support rings 22 secured to magnets 18 and a pole piece 24 is secured to each pole piece base 20 and support ring 22. A gap 25 is formed between pole pieces 24. A body part to be imaged is inserted into gap 25. MRI system 10 also may contain electronics 26 and a display 28. Electronics 26 may include a control system such as a computer, a transmitter, a receiver, an imager, and/or a memory.

Figure 3:
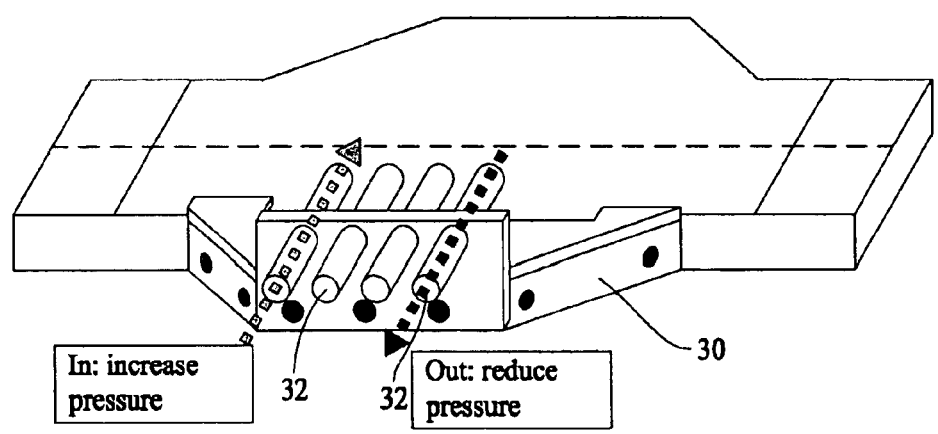
FIG. 3 illustrates an overview of a positioning apparatus.

FIG. 3 illustrates an overview of a positioning apparatus 30 including a plurality of movably coupled clamping members 32. Clamping members 32 are movable to adjust the positions of magnetic blocks 18 (shown in FIG. 1) as explained in greater detail below during fabrication of system 10.

Figure 4:
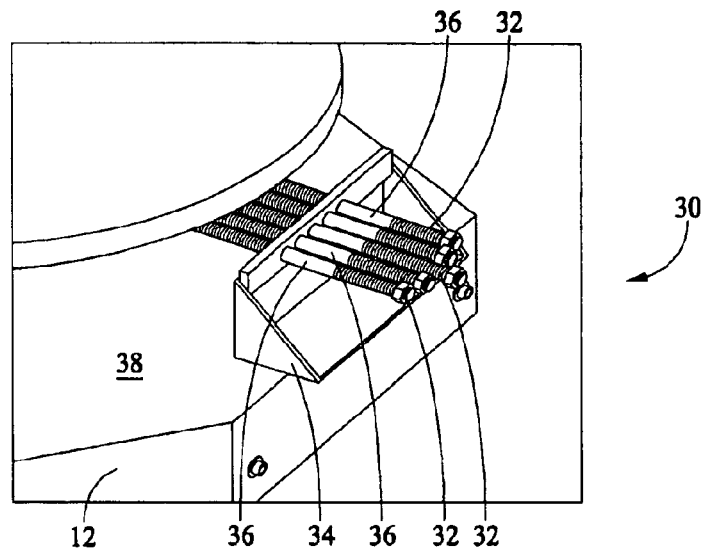
FIG. 4 is a perspective view of one embodiment of the positioning apparatus shown in FIG. 3.

FIG. 4 is a perspective view of one embodiment of positioning apparatus 30 (shown in FIG. 3) including a clamping member support 34 mounted on yoke 12. Clamping member support 34 includes a plurality of threaded sections 36 to which clamping members 32 are threadably coupled. Clamping members 32 extend in a plane substantially parallel to a plane defined by a surface 38 of yoke 12. Clamping member supports 34 and clamping members 32 are fabricated from a high-strength non-magnetic material such as 316 stainless steel.

In use, a first apparatus 30 is attached to one side of yoke 12, and a second apparatus 30 is attached to an opposite side of yoke 12 such that first and second apparatus 30 are positioned with clamping members 32 of first apparatus 30 substantially aligned with clamping members 32 of second apparatus 30. A plurality of blocks 18 are clamped forming a row between opposing clamping members 32 as explained in more detail below. To move blocks 18, a clamping member 32 is loosened to reduce the pressure in a first direction, and an opposing clamping member 32 is tightened to shift blocks 18 in a second direction opposite the first direction. In an exemplary embodiment, and as best shown in FIG. 8, four apparatuses 30 are employed to allow for both row positioning and column positioning.

Figure 5:
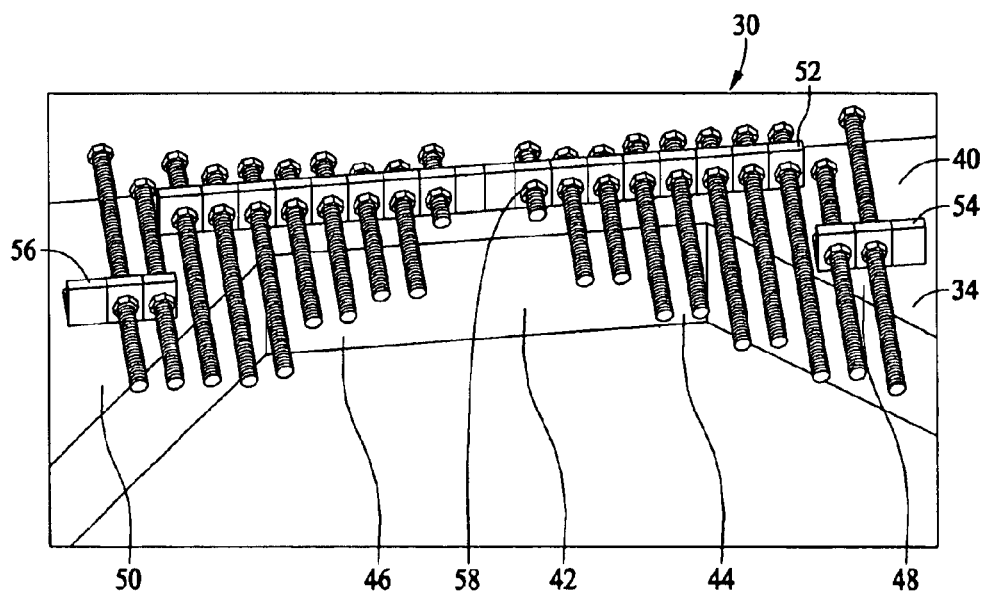
FIG. 5 is a perspective view of one embodiment of the positioning apparatus shown in FIG. 3.
Figure 6:
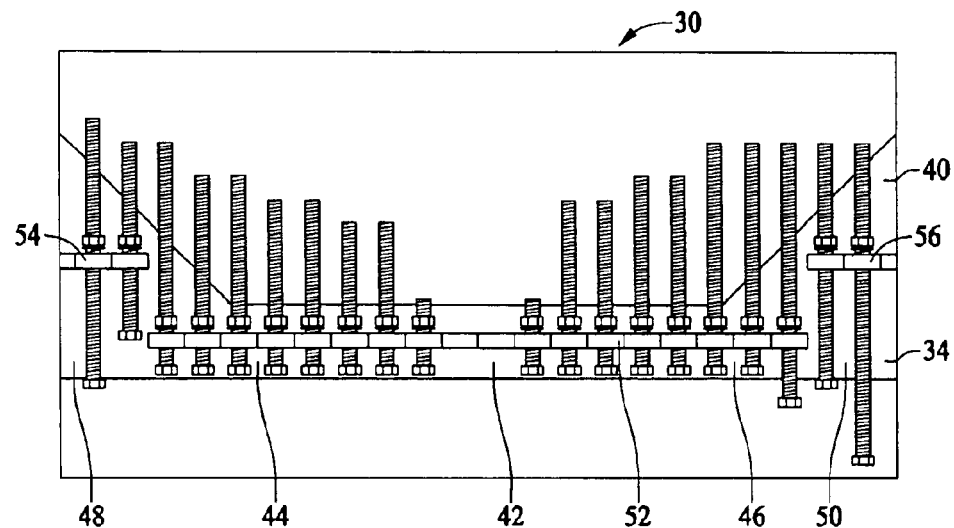
FIG. 6 is a top view of one embodiment of the positioning apparatus shown in FIG. 3.

FIG. 5 is a perspective view and FIG. 6 is a top view of one embodiment of positioning apparatus 30. Clamping support member 34 includes a plate 40 including a linearly extending middle section 42 having a first end 44 and a second end 46. Plate 40 further includes a first end section 48 extending obliquely from first end 44, and a second end section 50 extending obliquely from second end 46. In an exemplary embodiment, end sections 48 and 50 extend at approximately sixty degrees such when four positioning apparatuses 30 are positioned in a square, a hexagon opening is formed. A first clamping member holder 52 extends at least over middle section 42. In the exemplary embodiment, first clamping member holder 52 extends into both end sections 48 and 50. A second clamping member holder 54 is mounted to first end section 48. A third clamping member holder 56 is mounted to second end section 50. Second and third clamping member holders 54 and 56 are linearly aligned with each other and are both nonlinear with first clamping member holder 52. Clamping members 32 extend through bores 58 in holders 52, 54, and 56, and are held in place with a plurality of nuts 60. Bores 58 may or may not be threaded. Clamping members 32 include a threaded body such that at least a portion of clamping members 32 have threads thereon.

Figure 7:
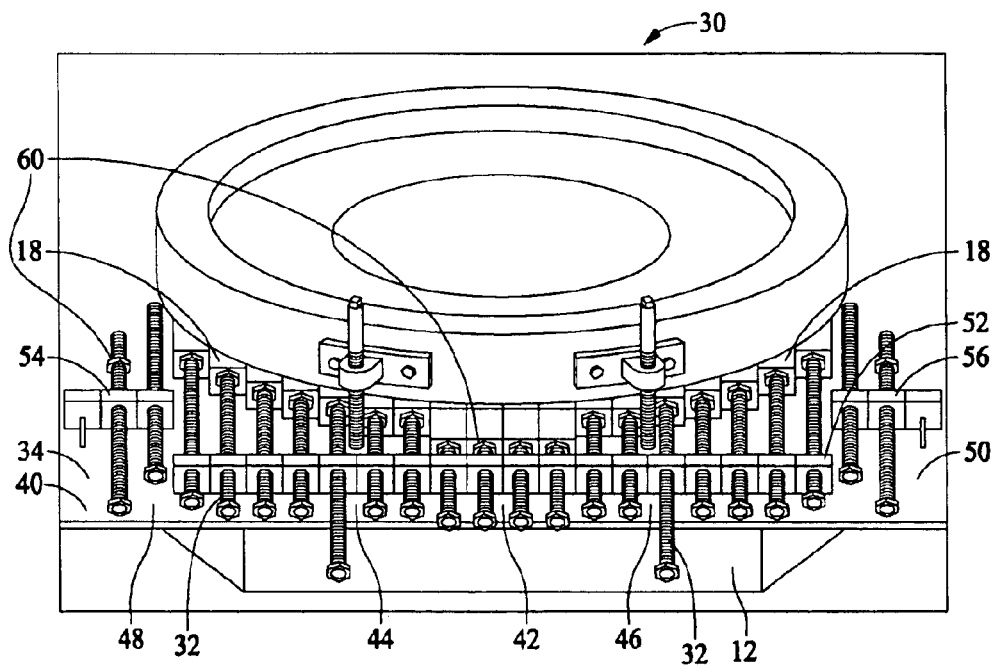
FIG. 7 illustrates one embodiment of the positioning apparatus shown in FIG. 3 in use.
Figure 8:
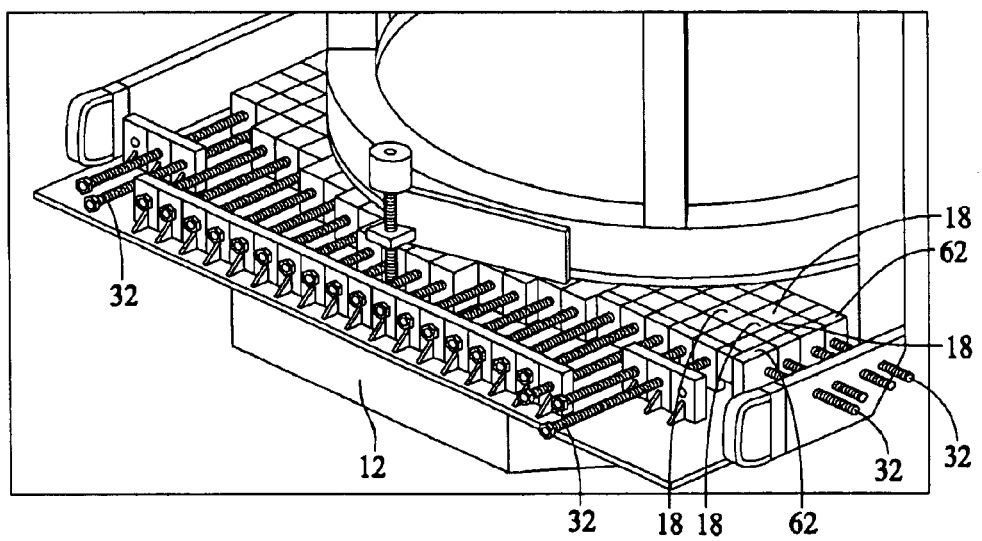
FIG. 8 illustrates one embodiment of the positioning apparatus shown in FIG. 3 in use.

FIGS. 7 and 8 illustrate positioning apparatus 30 in use to position blocks 18. In one embodiment, clamping member supports 34 are first attached to yoke 12 by bolts at a plurality of sides (e.g., front side and back side). A plurality of clamping members 32 are attached at four sides (front side, back side, left side, and right side) in a fashion that tips of clamping members 32 will push against a non-magnetic spacer 62 and cause a force (pressure) against magnetic blocks 18.

After attaching clamping members 32 to clamping member supports 34, opposite nuts 60 (e.g. front and back or right and left) for the same row or column are tightened to add pressure to eliminate gaps between magnetic blocks 18 until all magnetic blocks 18 are being tightened with a good packing factor in both front-back and left-right directions.

An offset of magnetic blocks 18 from a designed magnet center is measured, and block locations are adjusted by slightly releasing one side clamping member 32, and tightening an opposite clamping member 32 (to add pressure) to push a block 18 to its desired location. Working from a center row gradually toward both sides (right, left), then working from a center column gradually toward both faces (front, back), the above process is repeated on non-center rows and columns if needed until all blocks 18 are in their desired location. After all blocks 18 are in desired locations, permanent clamps (not shown) are applied to maintain blocks 18 fixedly, and clamping members 32 and clamping member supports 34 are removed.

The herein described methods and apparatus provide a novel approach to positioning magnetized blocks on a yoke for an MRI magnetic field generator. The herein described methods and apparatus also provide for a portable method and apparatus for positioning magnetized blocks.

Exemplary embodiments of methods and apparatus for positioning magnetized blocks are described above in detail. The methods and apparatus are not limited to the specific embodiments described herein, but rather, components of each method and apparatus may be utilized independently and separately from other components described herein. In addition, each method and apparatus component can also be used in combination with other components described herein.

While the invention has been described in terms of various specific embodiments, those skilled in the art will recognize that the invention can be practiced with modification within the spirit and scope of the claims.

What is claimed is:

1. A method for positioning permanent magnetic blocks, said method comprising:

providing a plurality of magnetized blocks;

positioning the magnetized blocks on a yoke in a row by applying a mechanical force at a first end of the row with a first clamping member and at a second end of the row with a second clamping member; and repositioning the blocks by:

reducing the mechanical force at the first end by moving the first clamping member away from the first end; and moving the second clamping member toward the second end.

2. A method in accordance with claim 1 wherein said reducing the mechanical force comprises reducing the mechanical force at the first end by moving the first clamping member away from the first end by rotating the first clamping member.

3. A method in accordance with claim 2 wherein said moving the second clamping member toward the second end further comprises moving the second clamping member toward the second end by rotating the second clamping member.

4. A method in accordance with claim 1 wherein said positioning the magnetized blocks on a yoke in a row further comprises positioning the magnetized blocks on a yoke in a plurality of rows and columns perpendicular to the rows by applying a mechanical force at a first end of each row with a first row clamping member, at a second end of each row with a second row clamping member, at a first end of each column with a first column clamping member, and at a second end of each column with a second column clamping member, said repositioning the blocks further comprises repositioning the blocks by:

reducing the mechanical force at the first end of at least one row by moving a first row clamping member away from a respective first end;

moving a respective second row clamping member toward the respective second end;

reducing the mechanical force at the first end of at least one column by moving a first column clamping member away from a respective first end; and moving a respective second column clamping member toward the respective second end.

5. A method in accordance with claim 4 wherein said reducing the mechanical force at the first end of at least one row by moving a first row clamping member away from a respective first end comprises reducing the mechanical force at the first end of at least one row by moving a first row clamping member away from a respective first end by rotating the first row clamping member.

6. A magnetic block positioning apparatus comprising:
   a yoke having a first end and a second end distal from said first end;
   a first clamping member support directly attached to said yoke at said first end;
   a first clamping member movably coupled to said first clamping member support;
   a second clamping member support directly attached to said yoke at said second end; and
   a second clamping member movably coupled to said second clamping member support.

7. An apparatus in accordance with claim 6 wherein said first clamping member support comprises a threaded section, said first clamping member threadably coupled to said threaded section.

8. An apparatus in accordance with claim 6 wherein said first clamping member support comprises a bore, said first clamping member comprises a threaded body, said apparatus further comprises:
   a first nut threadably engaged to said first clamping member on a first side of said bore; and
   a second nut threadably engaged to said first clamping member on a second side of said bore.

9. An apparatus in accordance with claim 6 wherein said yoke substantially planar defining a yoke plane, said first clamping member extending in a plane substantially parallel the yoke plane.

10. An apparatus in accordance with claim 9 wherein said second clamping member extending in a plane substantially parallel the yoke plane.

11. An apparatus in accordance with claim 10 wherein said second clamping member substantially axially aligned with said first clamping member.

12. An apparatus in accordance with claim 6 further comprising a plurality of magnetic blocks extending between said first clamping member and said second clamping member.

13. An apparatus in accordance with claim 6 further comprising a third clamping member support attached to said yoke at a third end of said yoke, said third clamping member support extending perpendicular to said first and second clamping member supports.

14. An apparatus in accordance with claim 13 further comprising:
   a fourth clamping member support attached to said yoke at a fourth end of said yoke, said fourth clamping member support extending perpendicular to said first and second clamping member supports;
   a third clamping member moveably coupled to said third clamping member support; and
   a fourth clamping member moveably coupled to said fourth clamping member support.

15. An apparatus in accordance with claim 14 wherein said first clamping member, said second clamping member, said third clamping member, and said fourth clamping member all extending in a plane parallel to a plane defined by a top surface of said yoke.

16. A magnetic block positioning apparatus comprising:
   a plate attached directly to a yoke, said plate comprising:
   a linearly extending middle section having a first end and a second end;
   a first end section extending obliquely from said first end; and
   a second end section extending obliquely from said second end;
   a first clamping member holder extending at least over said middle section; and
   a second clamping member holder mounted to said first end section, said second clamping member holder nonlinear with said first clamping member holder.

17. An apparatus in accordance with claim 16 wherein said first end section extends obliquely at approximately sixty degrees from said first end, said second end section extends obliquely at approximately sixty degrees from said second end.

18. An apparatus in accordance with claim 17 wherein said first clamping member holder extending into said first end section and said second end section.

19. An apparatus in accordance with claim 18 further comprising a third clamping member holder mounted to said second end section, said third clamping member nonlinear with said first clamping member holder.

20. An apparatus in accordance with claim 19 wherein said third clamping holder linear with said second clamping holder.

* * * * *